(12) United States Patent
Lee et al.

(10) Patent No.: US 8,497,211 B2
(45) Date of Patent: Jul. 30, 2013

(54) INTEGRATED PROCESS MODULATION FOR PSG GAPFILL

(75) Inventors: Young S. Lee, San Jose, CA (US); Anchuan Wang, San Jose, CA (US); Lan Chia Chan, San Jose, CA (US); Shankar Venkataraman, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 13/490,426

(22) Filed: Jun. 6, 2012

(65) Prior Publication Data
US 2012/0325773 A1    Dec. 27, 2012

Related U.S. Application Data

(60) Provisional application No. 61/500,853, filed on Jun. 24, 2011.

(51) Int. Cl.
*H01L 21/311*        (2006.01)

(52) U.S. Cl.
USPC ............. 438/694; 438/703; 438/743; 216/37; 216/80

(58) Field of Classification Search
USPC ............... 216/37, 80; 438/689, 694, 703, 743
See application file for complete search history.

(56) References Cited

U.S. PATENT DOCUMENTS

| | | | |
|---|---|---|---|
| 4,468,413 A | 8/1984 | Bachmann | |
| 4,690,746 A | 9/1987 | McInerney et al. | |
| 4,737,379 A | 4/1988 | Hudgens et al. | |
| 4,835,005 A | 5/1989 | Hirooka et al. | |
| 4,851,370 A | 7/1989 | Doklan et al. | |
| 4,872,947 A | 10/1989 | Wang et al. | |
| 4,890,575 A | 1/1990 | Ito et al. | |
| 4,892,753 A | 1/1990 | Wang et al. | |
| 4,894,352 A | 1/1990 | Lane et al. | |
| 4,960,488 A | 10/1990 | Law et al. | |

(Continued)

FOREIGN PATENT DOCUMENTS

CN    1473353 A    2/2004
EP    0 496 543 A2    7/1992

(Continued)

OTHER PUBLICATIONS

International Search Report and Written Opinion for PCT Application No. PCT/US2012/043384, mailed on Jan. 10, 2013, 9 pages.

(Continued)

*Primary Examiner* — Roberts Culbert
(74) *Attorney, Agent, or Firm* — Kilpatrick Townsend & Stockton LLP

(57) ABSTRACT

A method of depositing a phosphosilicate glass (PSG) film on a substrate disposed in a substrate processing chamber includes depositing a first portion of the PSG film over the substrate using a high-density plasma process. Thereafter, a portion of the first portion of the PSG film may be etched back. The etch back process may include flowing a halogen precursor to the substrate processing chamber, forming a high-density plasma from the halogen precursor, and terminating flowing the halogen precursor after the etch back. The method also includes flowing a halogen scavenger to the substrate processing chamber to react with residual halogen in the substrate processing chamber, and exposing the first portion of the PSG film to a phosphorus-containing gas to provide a substantially uniform phosphorus concentration throughout the first portion of the PSG film.

16 Claims, 9 Drawing Sheets

U.S. PATENT DOCUMENTS

| | | |
|---|---|---|
| 5,000,113 A | 3/1991 | Wang et al. |
| 5,013,691 A | 5/1991 | Lory et al. |
| 5,061,838 A | 10/1991 | Lane et al. |
| 5,089,442 A | 2/1992 | Olmer |
| 5,156,881 A | 10/1992 | Okano et al. |
| 5,215,787 A | 6/1993 | Homma |
| 5,252,178 A | 10/1993 | Moslehi |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,290,382 A | 3/1994 | Zarowin et al. |
| 5,302,233 A | 4/1994 | Kim et al. |
| 5,314,724 A | 5/1994 | Tsukune et al. |
| 5,319,247 A | 6/1994 | Matsuura |
| 5,334,552 A | 8/1994 | Homma |
| 5,362,526 A | 11/1994 | Wang et al. |
| 5,385,763 A | 1/1995 | Okano et al. |
| 5,399,529 A | 3/1995 | Homma |
| 5,413,967 A | 5/1995 | Matsuda et al. |
| 5,416,048 A | 5/1995 | Blalock et al. |
| 5,420,075 A | 5/1995 | Homma et al. |
| 5,429,995 A | 7/1995 | Nishiyama et al. |
| 5,468,342 A | 11/1995 | Nulty et al. |
| 5,474,589 A | 12/1995 | Ohga et al. |
| 5,554,418 A | 9/1996 | Ito et al. |
| 5,563,105 A | 10/1996 | Dobuzinsky et al. |
| 5,571,576 A | 11/1996 | Qian et al. |
| 5,599,740 A | 2/1997 | Jang et al. |
| 5,624,582 A | 4/1997 | Cain |
| 5,645,645 A | 7/1997 | Zhang et al. |
| 5,648,175 A | 7/1997 | Russell et al. |
| 5,661,093 A | 8/1997 | Ravi et al. |
| 5,679,606 A | 10/1997 | Wang et al. |
| 5,712,185 A | 1/1998 | Tsai et al. |
| 5,719,085 A | 2/1998 | Moon et al. |
| 5,756,402 A | 5/1998 | Jimbo et al. |
| 5,804,259 A | 9/1998 | Robles |
| 5,850,105 A | 12/1998 | Dawson et al. |
| 5,858,876 A | 1/1999 | Chew |
| 5,872,052 A | 2/1999 | Iyer |
| 5,872,058 A | 2/1999 | Van Cleemput et al. |
| 5,891,349 A | 4/1999 | Tobe et al. |
| 5,910,342 A | 6/1999 | Hirooka et al. |
| 5,913,140 A | 6/1999 | Roche et al. |
| 5,915,190 A | 6/1999 | Pirkle |
| 5,920,792 A | 7/1999 | Lin |
| 5,937,323 A | 8/1999 | Orczyk et al. |
| 5,939,831 A | 8/1999 | Fong et al. |
| 5,944,902 A | 8/1999 | Redeker et al. |
| 5,953,635 A | 9/1999 | Andideh |
| 5,968,610 A | 10/1999 | Liu et al. |
| 5,976,327 A | 11/1999 | Tanaka |
| 5,990,000 A | 11/1999 | Hong et al. |
| 5,990,013 A | 11/1999 | Berenguer et al. |
| 6,013,191 A | 1/2000 | Nasser-Faili et al. |
| 6,013,584 A | 1/2000 | M'Saad |
| 6,030,666 A | 2/2000 | Lam et al. |
| 6,030,881 A | 2/2000 | Papasouliotis et al. |
| 6,037,018 A | 3/2000 | Jang et al. |
| 6,039,851 A | 3/2000 | Iyer |
| 6,059,643 A | 5/2000 | Hu et al. |
| 6,071,573 A | 6/2000 | Koemtzopoulos et al. |
| 6,077,764 A | 6/2000 | Sugiarto et al. |
| 6,087,278 A | 7/2000 | Kim et al. |
| 6,099,697 A | 8/2000 | Hausmann |
| 6,136,685 A | 10/2000 | Narwankar et al. |
| 6,150,628 A | 11/2000 | Smith et al. |
| 6,167,834 B1 | 1/2001 | Wang et al. |
| 6,170,428 B1 | 1/2001 | Redeker et al. |
| 6,182,602 B1 | 2/2001 | Redeker et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,691 B1 | 3/2001 | Lee |
| 6,197,705 B1 | 3/2001 | Vassiliev |
| 6,200,911 B1 | 3/2001 | Narwankar et al. |
| 6,203,863 B1 | 3/2001 | Liu et al. |
| 6,204,200 B1 | 3/2001 | Shieh et al. |
| 6,217,658 B1 | 4/2001 | Orczyk et al. |
| 6,228,751 B1 | 5/2001 | Yamazaki et al. |
| 6,313,010 B1 | 11/2001 | Nag et al. |
| 6,335,288 B1 | 1/2002 | Kwan et al. |
| 6,395,150 B1 | 5/2002 | Van Cleemput et al. |
| 6,479,098 B1 | 11/2002 | Yoo et al. |
| 6,503,843 B1 | 1/2003 | Xia et al. |
| 6,584,987 B1 | 7/2003 | Cheng et al. |
| 6,596,654 B1 | 7/2003 | Bayman et al. |
| 6,602,434 B1 | 8/2003 | Hung et al. |
| 6,794,290 B1 | 9/2004 | Papasouliotis et al. |
| 6,797,646 B2 | 9/2004 | Ngai et al. |
| 6,802,944 B2 | 10/2004 | Ahmad et al. |
| 6,808,748 B2 | 10/2004 | Kapoor et al. |
| 6,846,745 B1 | 1/2005 | Papasouliotis et al. |
| 6,869,880 B2 | 3/2005 | Krishnaraj et al. |
| 6,890,403 B2 | 5/2005 | Cheung et al. |
| 6,903,031 B2 | 6/2005 | Karim et al. |
| 6,908,862 B2 | 6/2005 | Li et al. |
| 7,052,552 B2 | 5/2006 | Kwan et al. |
| 7,205,240 B2 | 4/2007 | Karim et al. |
| 7,217,658 B1 | 5/2007 | Bayman et al. |
| 7,524,750 B2 | 4/2009 | Nemani et al. |
| 7,745,350 B2 | 6/2010 | Wang et al. |
| 2001/0028922 A1 | 10/2001 | Sandhu |
| 2002/0187655 A1 | 12/2002 | Tan et al. |
| 2003/0127427 A1 | 7/2003 | Yuan et al. |
| 2003/0207580 A1 | 11/2003 | Li et al. |
| 2003/0216006 A1 | 11/2003 | Li et al. |
| 2004/0043626 A1 | 3/2004 | Chou et al. |
| 2004/0048485 A1 | 3/2004 | Min et al. |
| 2004/0126952 A1 | 7/2004 | Gondhalekar et al. |
| 2004/0145029 A1 | 7/2004 | Adetutu et al. |
| 2004/0166694 A1 | 8/2004 | Won et al. |
| 2004/0192061 A1 | 9/2004 | Sasaki et al. |
| 2004/0245091 A1 | 12/2004 | Karim et al. |
| 2005/0103266 A1 | 5/2005 | Chandran et al. |
| 2005/0124166 A1 | 6/2005 | Krishnaraj et al. |
| 2005/0136610 A1 | 6/2005 | Kitagawa et al. |
| 2005/0250340 A1 | 11/2005 | Chen et al. |
| 2006/0046508 A1 | 3/2006 | Nemani et al. |
| 2006/0292894 A1 | 12/2006 | Vellaikal et al. |
| 2008/0299775 A1 | 12/2008 | Wang et al. |

FOREIGN PATENT DOCUMENTS

| | | |
|---|---|---|
| JP | 61-276977 A | 12/1986 |
| JP | 2058836 A | 2/1990 |
| JP | 4-239750 | 8/1992 |
| JP | 4-341568 A | 11/1992 |
| JP | 7-161703 A | 6/1995 |
| KR | 2001-0049906 A | 6/2001 |
| KR | 2009-0026107 A | 3/2009 |
| WO | 92/20833 A1 | 11/1992 |
| WO | 2012/177789 A2 | 12/2012 |

OTHER PUBLICATIONS

Abraham, "Reactive Facet Tapering of Plasma Oxide for Multilevel Interconnect Applications," VMIC Conference. pp. 115-121 (1987).

Chang et al. "Frequency Effects and Properties of Plasma Deposited Fluorinated Silicon Nitride", American Vacuum Society. 1988. pp. 524-532.

Cheng, L.-Y. et al., "New Test Structure to Identify Step Coverage Mechanisms in Chemical Vapor Deposition of Silicon Dioxide," Appl. Phys. Lett., 58 (19), May 13, 1991, p. 2147-2149.

Fukada et al. "Preparation of SiOF Films with Low Dielectric Constant by ECR Plasma CVD", Japan. DUMIC Conference. Feb. 1995. pp. 43-49.

Galiano et al. "Stress-Temperature Behavior of Oxide Films Used for Intermetal Dielectric Applications", VMIC Conference. Jun. 1992. pp. 100-106.

Hausmann, D. et al., "Rapid Vapor Deposition of Highly Conformal Nanolaminates," Science, 298, Oct. 11, 2002, p. 402-406.

Hayasaka, N. et al. "High Quality Low Dielectric Constant SiO2 CVD Using High Density Plasma," Proceedings of the Dry Process Symposium, 1993, pp. 163-168.

Laxman, "Low ε Dielectrics: CVD Fluorinated Silicon Dioxides", Semiconductor International. May 1995. pp. 71-74.

Lee et al., "Dielectric Planarization Techniques for Narrow Pitch Multilevel Interconnects," VMIC Conference, pp. 85-92 (1987).

Matsuda et al. "Dual Frequency Plasma CVD Fluorosilicate Glass: Deposition for 0.25 um Interlevel Dielectrics", DUMIC Conference. Feb. 1995. pp. 22-28.

Meeks et al., "Modeling of SiO 2 deposition in high density plasma reactors and comparisons of model predictions with experimental measurements," J. Vac. Sci. Technol. A, 16(2):544-563 (1998).

Musaka, "Single Step Gap Filling Technology fo Subhalf Micron Metal Spacings on Plasma Enhanced TEOS/O2 Chemical Vapor Deposition System," International Conference on Solid State Devices and Materials pp. 510-512, held in Japan, (1993).

Nalwa, H.S.,"Handbook of Low and High Dielectric Constant Materials and Their Applications", vol. 1, p. 66 (1999).

Nguyen, S.V., "High-Density Plasma Chemical Vapor Deposition of Silicon-Based Dielectric Films for Integrated Circuits," Journal of Research and Development, vol. 43, 1/2 (1999).

Ota, K. et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, p. 138-139.

Qian et al., "High Density Plasma Deposition and Deep Submicron Gap Fill with Low Dielectric Constant SiO2 Films," DUMIC Conference, Feb. 21-22, 1995, pp. 50-56, held in California.

Robles et al. "Effects of RF Frequency and Deposition Rates on the Moisture Resistance of PECVD TEOS-Based Oxide Films", ECS Extended Abstracts. vol. 92-1. May 1992. pp. 215-216.

Shapiro et al. "Dual Frequency Plasma CVD Fluorosilicate Glass: Water Absorption and Stability", DUMIC Conference. Feb. 1995. pp. 118-123.

Usami et al. "Low Dielectric Constant Interlayer Using Fluorine-Doped Silicon Oxide", Jpn. J. Appl. Phys. vol. 33, Jan. 1994. pp. 408-412.

Vassiliev et al., "Trends in void-free pre-metal CVD dielectrics," Solid State Technology, Mar. 2001, pp. 129-136, www.solid-state.com.

Yu et al. "Step Coverage Study of Peteos Deposition for Intermetal Dielectric Applications", VMIC Conference. Jun. 1990. pp. 166-172.

Australian Patent Office Search Report from related SG Application No. SG 200806501-3, mailed on Feb. 12, 2009; 4 pages.

Australian Patent Office Search Report from corresponding SG Application No. SG 200806500-5, mailed on Feb. 12, 2009; 3 pages.

EP Search Report for Application No. 08163822.3, mailed on Aug. 7, 2009, 7 pages.

International Search Report and Written Opinion for PCT Application No. PCT/US/08/65134, mailed on Aug. 15, 2008, 8 pages.

Non-Final Office Action for U.S. Appl. No. 11/553,772, mailed on Oct. 15, 2008, 11 pages.

Notice of Allowance for U.S. Appl. No. 11/553,772, mailed on Dec. 19, 2008, 10 pages.

Non-Final Office Action for U.S. Appl. No. 12/204,523, mailed on Apr. 15, 2009, 14 pages.

Non-Final Office Action for U.S. Appl. No. 12/204,523, mailed on Aug. 4, 2009, 11 pages.

Notice of Allowance for U.S. Appl. No. 12/204,523, mailed on Feb. 17, 2010, 6 pages.

Non-Final Office Action for U.S. Appl. No. 10/456,611, mailed on Sep. 21, 2005, 18 pages.

Final Office Action for U.S. Appl. No. 10/456,611, mailed on Mar. 1, 2006, 14 pages.

Non-Final Office Action for U.S. Appl. No. 10/456,611, mailed on Aug. 4, 2006, 15 pages.

Notice of Allowance for U.S. Appl. No. 10/456,611, mailed on Feb. 6, 2007, 7 pages.

Non-Final Office Action for U.S. Appl. No. 11/757,637, mailed on Sep. 2, 2009, 7 pages.

INTEGRATED PROCESS MODULATION FOR PSG GAPFILL

CROSS-REFERENCE TO RELATED APPLICATIONS

This application claims benefit of priority under 35 U.S.C. §119(e) of U.S. Provisional Application No. 61/500, 853, filed Jun. 24, 2011, the entire contents of which are incorporated herein by reference in their entirety for all purposes.

BACKGROUND

One of the persistent challenges faced in the development of semiconductor technology is the desire to increase the density of circuit elements and interconnections on substrates without introducing spurious interactions between them. Unwanted interactions are typically prevented by providing gaps or trenches that are filled with electrically insulative material to isolate the elements both physically and electrically. As circuit densities increase, however, the widths of these gaps decrease, increasing their aspect ratios and making it progressively more difficult to fill the gaps without leaving voids. The formation of voids when the gap is not filled completely is undesirable because they may adversely affect operation of the completed device, such as by trapping impurities within the insulative material.

Common techniques that are used in such gapfill applications are chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that the plasma species are even more reactive. While each of these techniques falls broadly under the umbrella of "CVD techniques," each of them has characteristic properties that make them more or less suitable for certain specific applications.

HDP-CVD systems form a plasma that is at least approximately two orders of magnitude greater than the density of a standard, capacitively coupled plasma CVD system. Examples of HDP-CVD systems include inductively coupled plasma systems and electron cyclotron resonance (ECR) plasma systems, among others. HDP-CVD systems generally operate at lower pressure ranges than low-density plasma systems. The low chamber pressure employed in HDP-CVD systems provides active species having a long mean-free-path and reduced angular distribution. These factors, in combination with the plasma density, contribute to a significant number of constituents from the plasma reaching even the deepest portions of closely spaced gaps, providing a film with improved gapfill capabilities compared with films deposited in a low-density plasma CVD system.

Another factor that allows films deposited by HDP-CVD techniques to have improved gapfill characteristics is the promotion of sputtering by the high density of the plasma, simultaneous with film deposition. The sputtering component of HDP deposition processes slows deposition on certain features, such as the corners of raised surfaces, thereby contributing to the increased gapfill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma towards the substrate. The electric field can be applied throughout the HDP deposition process for further promotion of sputtering and to provide better gapfill characteristics for a given film.

It was initially thought that because of their simultaneous deposition/sputter nature, HDP-CVD processes could fill the gaps or trenches that were created in almost any application. Semiconductor manufacturers have discovered, however, that there is a practical limit to the aspect ratio of gaps that HDP-CVD processes are able to fill. For example, one HDP-CVD process commonly used to deposit a silicon oxide film forms a plasma from a process gas that includes silane $SiH_4$, molecular oxygen $O_2$, and argon Ar. It has been reported that when such a process is used to fill certain narrow-width high-aspect-ratio gaps, the sputtering caused by argon in the process gas may hamper the gapfill efforts. Specifically, it has been reported that material sputtered by argon in the process deposits on the upper portions of the sidewalls of the gaps being filled at a rate faster than at the lower portions. This, in turn, may result in the formation of a void in the gap if the upper areas of growth join before the gap is completely filled.

FIG. 1 provides schematic cross-sectional views of a silicon oxide film at different stages of deposition to illustrate the potential gapfill limitation associated with some CVD processes. The gapfill problem is illustrated in somewhat exaggerated form to illustrate the problem better. The top portion of FIG. 1 shows the initial structure 104 in which a gap 120 is defined by two adjacent features 124 and 128 having horizontal surfaces 122, with the horizontal surface at the bottom of the gap being denoted 132. As shown in structure 108, i.e. the second portion of the figure from the top, a conventional HDP-CVD silicon oxide deposition process results in direct deposition on the horizontal surface 132 at the bottom of the gap 120 and on the horizontal surfaces 122 above the features 124 and 128. It also, however, results in indirect deposition (referred to as "redeposition") on the sidewalls 140 of the gap 120 due to recombination of material sputtered from the silicon oxide film as it grows. In certain small-width, high-aspect-ratio applications, the continued growth of the silicon oxide film results in formations 136 on the upper section of the sidewall 140 that grow towards each other at a rate of growth exceeding the rate at which the film grows laterally on the lower portions of the sidewall. This trend is shown in structures 108 and 112, with the final result in structure 116 being the formation of a void 144 within the film. The probability of forming a void is very directly related to the rate and character of the redeposition.

There accordingly remains a general need in the art for improving gapfill techniques.

SUMMARY

Embodiments of the present invention provide methods of depositing a phosphosilicate glass (PSG) film on a substrate disposed in a substrate processing chamber. In an embodiment of the present invention, the substrate may have a gap formed between adjacent raised surfaces. The method includes depositing a first portion of the PSG film over the substrate and within the gap using a high-density plasma process. Thereafter, a portion of the first portion of the PSG film may be etched back. The etch back process may include flowing a halogen precursor to the substrate processing chamber, forming a high-density plasma from the halogen precursor, and terminating flowing the halogen precursor after the etch back. The method also includes flowing a halogen scavenger to the substrate processing chamber to react with residual halogen in the substrate processing chamber, and exposing the first portion of the PSG film to a phosphorus-containing gas to provide a substantially uniform phosphorus concentration throughout the first portion of the PSG film. The method also includes depositing a second portion of the PSG film over the first portion of the PSG film and within the gap using a high-density plasma process.

In an embodiment, the halogen precursor may comprise fluorine and the halogen scavenger may comprise $O_2$. The phosphorus-containing gas may comprise $PH_3$.

In another embodiment, depositing the first portion of the PSG film may comprise flowing a silicon-containing gas into the substrate processing chamber, flowing an oxygen-containing gas into the substrate processing chamber, flowing the phosphorus-containing gas into the substrate processing chamber, flowing a fluent gas into the substrate processing chamber, and forming a first high-density plasma from the silicon-containing gas, the oxygen-containing gas, the phosphorus-containing gas, and the fluent gas. The first portion of the PSG film may be deposited using the first high-density plasma at a deposition rate between 500 and 6000 Å/min and with a deposition/sputter ratio greater than 20. The deposition/sputter ratio may be defined as a ratio of a net deposition rate and a blanket sputtering rate to the blanket sputtering rate.

In another embodiment, the silicon-containing gas may comprise $SiH_4$, the oxygen-containing gas may comprise $O_2$, and the phosphorus-containing gas may comprise $PH_3$.

In another embodiment, forming the high-density plasma from the halogen precursor may comprise inductively coupling a source radio-frequency power into the substrate processing chamber, the source radio-frequency power providing a power density on the substrate between 85,000 and 140,000 $W/m^2$.

In yet another embodiment, the method also includes etching back a portion of the second portion of the PSG film by flowing a halogen precursor through the first conduit from the halogen-precursor source to the substrate processing chamber, forming a high-density plasma from the halogen precursor, and terminating flowing the halogen precursor after the portion has been etched back. The halogen scavenger may be flowed to the substrate processing chamber to react with residual halogen in the substrate processing chamber. The first portion of the PSG film may be exposed to the phosphorus-containing gas to provide a substantially uniform phosphorus concentration throughout the second portion of the PSG film. A third portion of the PSG film may be deposited over the second portion of the PSG film and within the gap using a high-density plasma process.

In another embodiment of the present invention, a method of forming a PSG film on a substrate disposed in a processing chamber, where the substrate includes raised features forming gaps therebetween, includes depositing a first portion of the PSG film over the substrate and within the gaps using a high-density plasma process. A portion of the first portion of the PSG film may be etched back using a halogen precursor. A halogen scavenger may be flowed to the processing chamber to react with residual halogen in the processing chamber. Thereafter, remaining portions of the first portion of the PSG film may be exposed to a phosphorus-containing gas to provide a substantially uniform phosphorus concentration throughout the first portion of the PSG film.

In yet another embodiment of the present invention, a method of depositing a PSG film on a substrate disposed in a processing chamber includes depositing a first portion of the PSG film over the substrate using a high-density plasma process. The method also includes etching the first portion of the PSG film using a high-density halogen plasma to provide an etched PSG film. The method also includes forming a plasma comprising a halogen scavenger in the substrate processing chamber to react with residual halogen in the substrate processing chamber from the etching step. Thereafter, the etched PSG film is exposed to a phosphorus-containing plasma to provide a substantially uniform phosphorus concentration throughout the etched PSG film, and thereafter a second portion of the PSG film is deposited over the etched PSG film using a high-density plasma process.

A further understanding of the nature and advantages of the present invention may be realized by reference to the remaining portions of the specification and the drawings.

DETAILED DESCRIPTION

Figure 1:
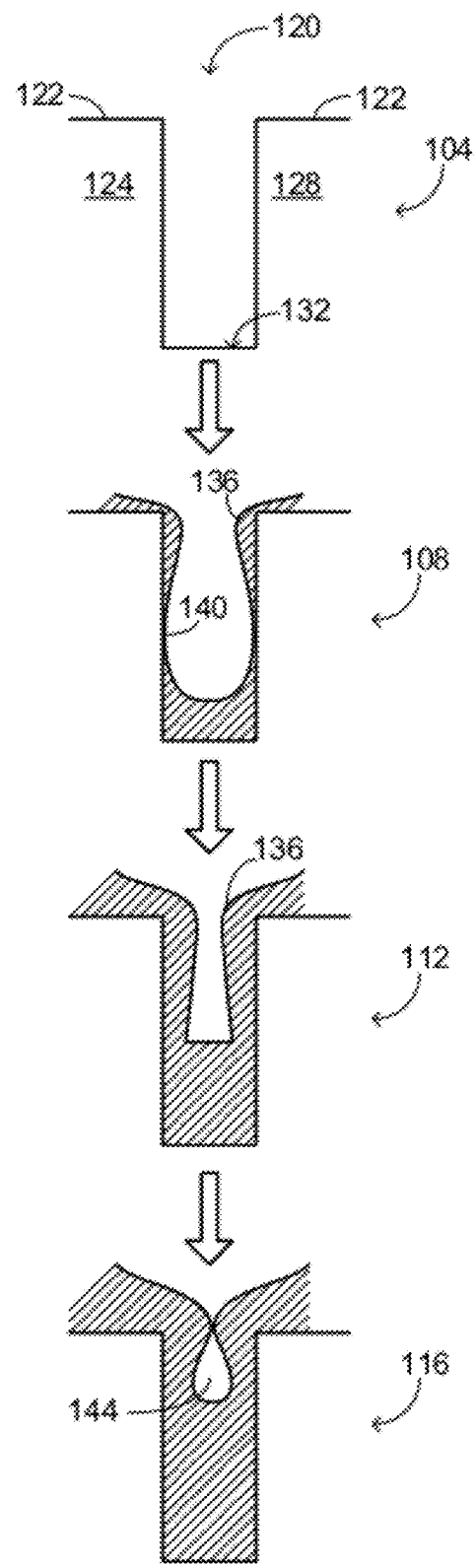
FIG. 1 provides schematic cross-sectional drawings illustrating the formation of a void during a prior-art gapfill process.

Embodiments of the invention are directed to methods of depositing a PSG layer to fill a gap in a surface of a substrate using a high-density-plasma CVD process. PSG films deposited according to the techniques of the invention have excellent gapfill capabilities and are able to fill gaps encountered in, for example, pre-metal dielectric and inter-metal dielectric processes. Films deposited by the methods of the invention are thus suitable for use in the fabrication of a variety of integrated circuits, including those that have a feature size on the order of or less than 28 nm.

As used herein, a high-density-plasma process is a plasma CVD process that includes simultaneous deposition and sputtering components and that employs a plasma having an ion density on the order of $10^{11}$ ions/$cm^3$ or greater. The relative levels of the combined deposition and sputtering characteristics of the high-density plasma may depend on such factors as the flow rates used to provide the gaseous mixture, the source power levels applied to maintain the plasma, the bias power applied to the substrate, and the like. The combination of such factors may conveniently be quantified with a "deposition/sputter ratio," sometimes denoted D/S to characterize the process:

$$\frac{D}{S} \equiv \frac{(\text{net deposition rate}) + (\text{blanket sputtering rate})}{(\text{blanket sputtering rate})}.$$

The deposition/sputter ratio increases with increased deposition and decreases with increased sputtering. As used in the definition of D/S, the "net deposition rate" refers to the deposition rate that is measured when deposition and sputtering are occurring simultaneously. The "blanket sputter rate" is the sputter rate measured when the process recipe is run without deposition gases; the pressure within the process chamber is adjusted to the pressure during deposition and the sputter rate measured on a blanket thermal oxide.

Other equivalent measures may be used to quantify the relative deposition and sputtering contributions of the HDP process, as is known to those of skill in the art. A common alternative ratio is the "etching/deposition ratio,"

$$\frac{E}{D} \equiv \frac{(\text{source-only deposition rate}) - (\text{net deposition rate})}{(\text{source-only deposition rate})},$$

which increases with increased sputtering and decreases with increased deposition. As used in the definition of E/D, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of D/S ratios. While D/S and E/D are not precise reciprocals, they are inversely related and conversion between them will be understood to those of skill in the art.

The desired D/S ratios for a given step in the HDP-CVD processes are generally achieved by including flows of precursor gases and, in some instances, flows of a fluent gas, which may also act as a sputtering agent. The elements comprised by the precursor gases react to form the film with the desired composition. For example, to deposit a silicon oxide film, the precursor gases may include a silicon-containing gas, such as silane $SiH_4$, and an oxidizing gas reactant such as molecular oxygen $O_2$. Dopants may be added to the film by including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like. The fluent gas may be provided with a flow of $H_2$ or with a flow of an inert gas, including a flow of He, or even a flow a heavier inert gas, such as Ne, Ar, or Xe. The level of sputtering provided by the different fluent gases is directly related to their atomic mass (or molecular mass in the case of $H_2$), with $H_2$ producing even less sputtering than He. Embodiments of the invention generally provide fluent-gas flows that have an average molecular mass less than 5 amu. This may be achieved by using flows of a single low-mass gas, such as with a flow of substantially pure $H_2$ or with a flow of substantially pure He. Alternatively, flows may sometimes be provided of multiple gases, such as by providing both a flow of $H_2$ and a flow of He, which mix in the HDP-CVD process chamber. Alternatively, the gas may sometimes be premixed so that a flow of $H_2$/He is provided in a mixed state to the process chamber. It is also possible to provide separate flows of higher-mass gases, or to include higher-mass gases in the premixture, with the relative flow rates and/or concentrations of the premixture being selected to maintain an average molecular mass less than 5 amu.

In high-aspect-ratio structures, the use of relatively high flow rates of low-mass fluent gases has been found generally to improve gapfill capability when compared with the more traditional use of fluent gases such as Ar. This is believed to be a consequence of the reduction in redeposition that is achieved by using He or $H_2$ as a fluent gas so that closure of the gap occurs less quickly. But even with the use of such low-mass fluent gases, there is a risk of corner clipping during deposition. This effect may be understood with reference to FIGS. 2A and 2B, which show the effect of the sputtering component of an HDP process respectively for a gap in a densely packed area and for a gap in an open area.

Figure 2A:
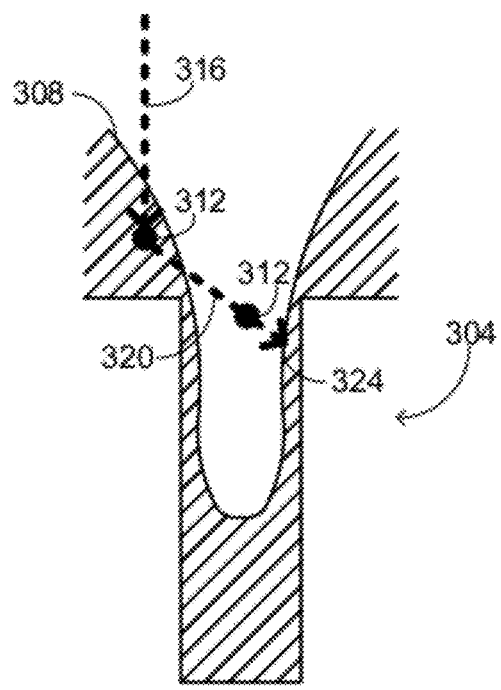
FIGS. 2A and 2B are schematic diagrams that respectively illustrate gapfill characteristics of densely packed areas and open areas in a structure.

In particular, the gap 304 in FIG. 2A is a high-aspect-ratio gap, with the material deposited using an HDP-CVD process forming a characteristic cusp structure 308 over the horizontal surfaces. Redeposition occurs as material 312 is sputtered from the cusp 308 in response to the impact of plasma ions along path 316. The sputtered material 312 follows a path 320 that encounters the sidewall 324 on the opposite side of the gap 304. This effect is symmetrical so that as material is sputtered away from the left side of the gap onto the right side, material is also sputtered away from the right side of the gap onto the left side. The redeposition of material protects against excess sputtering resulting in clipping of the corners.

Figure 2B:
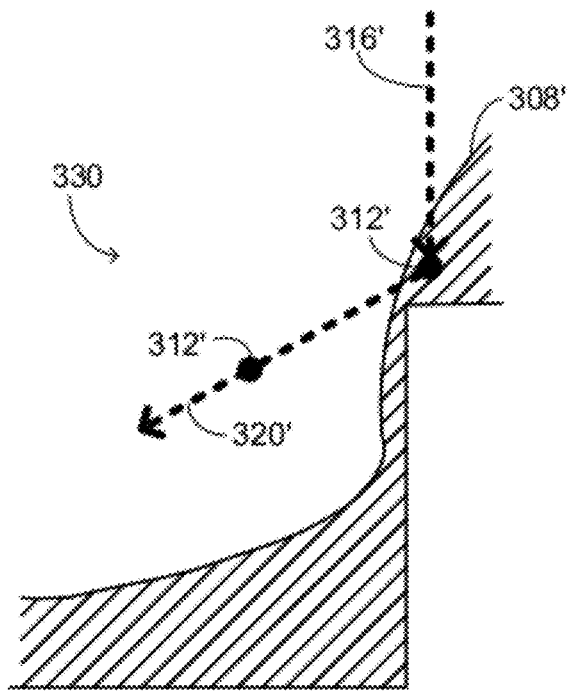

This symmetry is not present in the open areas, as illustrated with the open-area structure 330 shown in FIG. 2B. In this instance, the deposition causes the formation of a similar cusp 308', but when material 312' is sputtered along path 320' in response to the impact of plasma ions along path 316', the opposite side of the gap is too far away for the redeposition to be protective. The corner of the structure in FIG. 2B suffers the same ejection of material as does the corner of the structure in FIG. 2A, without the compensating effect of receiving material sputtered from the opposite side of the gap. As a consequence, there is an increased risk of clipping the corner and damaging the underlying structure.

Figure 3:
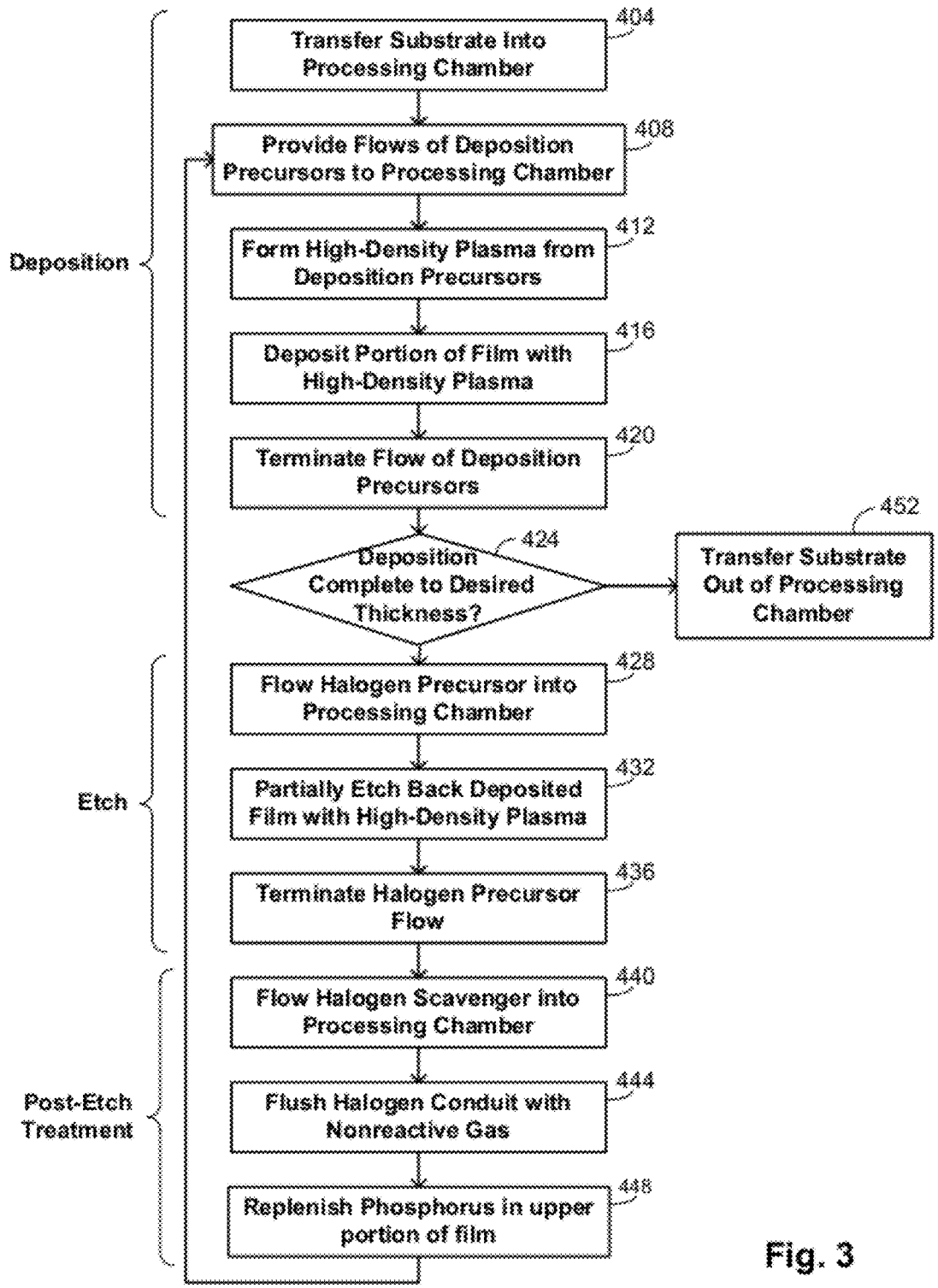
FIG. 3 is a flow diagram summarizing methods for depositing a film in embodiments of the invention.

Methods of the invention are summarized with the flow diagram of FIG. 3. Deposition of a film over a substrate begins at block 404 by transferring the substrate into a process chamber. The substrate is typically a semiconductor wafer, such as a 200-mm or 300-mm-diameter wafer. Flows of precursor gases are provided to the chamber at block 408, including a flow of a silicon precursor, a flow of an oxygen precursor, a flow of a phosphorus precursor, and a flow of a fluent gas. Table I provides exemplary flow rates for deposition of a PSG film using flows of monosilane $SiH_4$, molecular oxygen $O_2$, phosphine $PH_3$, hydrogen $H_2$, and He, although it should be understood that other precursor gases, including other dopant sources and fluent gases may be used as discussed above.

TABLE I

Exemplary Flow Rates for USG Deposition

| Flow Rates for 200-mm Wafer Process | | Flow Rates for 300-mm Wafer Process | |
|---|---|---|---|
| $\Phi(SiH_4)$ | 10-200 sccm | $\Phi(SiH_4)$ | 10-200 sccm |
| $\Phi(O_2)$ | 20-500 sccm | $\Phi(O_2)$ | 20-500 sccm |
| $\Phi(PH_3)$ | 3-30 sccm | $\Phi(PH_3)$ | 3-30 sccm |
| $\Phi(H_2)$ | 50-400 sccm | $\Phi(H_2)$ | 50-600 sccm |
| $\Phi(He)$ | 50-400 sccm | $\Phi(He)$ | 50-600 sccm |

As the table indicates, the flow rates of the precursor gases may be similar for 200-mm and 300-mm-diameter wafers, but the flow rate of the fluent gas is generally higher for the 300-mm wafers.

A high-density plasma is formed from the gaseous flows at block 412 by coupling energy into the chamber. A common technique for generating a high-density plasma is to couple RF energy inductively. The D/S ratio is determined not only by the flow rates for the gases, but also by the power density of energy coupled into the chamber, by the strength of a bias that may be applied to the substrate, by the temperature within the chamber, by the pressure within the chamber, and other such factors. In some embodiments, the deposition uses a source power density of between about 40,000 and 140,000 W/m$^2$, a substrate bias of between about 0.8 and 3.5 kW, a temperature of between about 250 and 450° C., and a pressure of between about 2.5 and 6 mTorr.

After completion of the deposition, the flows of the deposition precursors are terminated at block 420 and a check made at block 424 whether the desired thickness of the film has been reached. Embodiments if the invention include at least two deposition stages separated by an etching stage, and may frequently have 5-15 deposition stages or even more deposition stages depending on the specific characteristics of the gap being filled.

An etching phase of the process may begin at block 428 by flowing a halogen precursor, which typically comprises a fluorine precursor such as NF$_3$ or a chlorofluorocarbon. A high-density plasma is formed from the halogen precursor. In some embodiments, the source power density is between about 80,000 and 140,000 W/m$^2$, which corresponds to a total source power between about 6000 and 10,000 W for a 300-mm-diameter wafer and to a total source power between about 2500 and 4500 W for a 200-mm-diameter wafer. The inventors have found that the use of a high source power causes the deposition profile to be more symmetric than the use of lower source powers. In some embodiments, the total source power is distributed among top and side sources so that a majority of the source power is provided from side sources. For instance, the side source power may be 1-5 times the top source power, with it being three times the top source power in a particular embodiment.

The resulting halogen plasma is used at block 432 to etch back the deposited film. While the specific amount of material that may be etched is relatively dependent on the specific structure, it is generally true that the amount of material etched may be greater in later etching cycles than in earlier etching cycles. This is a general consequence of the fact that the overall topology of the substrate changes as a result of the sequence of deposition and etching steps. The general trend with the sequence of steps is that the topology becomes more amenable to greater etch amounts during the etching phase of the cycle. At block 436, the halogen precursor flow is terminated.

This etching phase is then followed with a treatment phase that may include any or all of the processes described in connection with blocks 440, 444, and/or 448. As indicated at block 440, a halogen scavenger may be flowed into the processing chamber to react with excess halogen that remains within the processing chamber. A suitable scavenger is O$_2$, although other scavengers may be used in alternative embodiments. At block 444, the halogen conduit to the processing chamber is flushed with a gas that is nonreactive with the halogen precursor, examples of which include Ar and He. Such a nonreactive gas may also be flowed through other conduits to the processing chamber to prevent backflow of the halogen into such conduits. At block 448, the substrate is exposed to a phosphorus-containing gas to replenish phosphorus at an upper surface of the deposited film that is depleted during the halogen scavenger treatment.

It is generally expected that the same precursors will be used for deposition of material during each of the deposition phases and that the same precursor will be used for removing material during each of the etching phases, although this is not a requirement of the invention. The amount of material deposited during each of the deposition phases is typically between 100 and 1000 Å, with the overall process requiring fewer cycles when larger deposition amounts are used per cycle. When each cycle deposits 300 Å, it may be necessary to use about six times as many cycles to deposit the same amount of material as when each cycle deposits 1000 Å.

Once the film has been grown to the desired thickness, the substrate is transferred out of the processing chamber as indicated at block 452.

Figure 4:
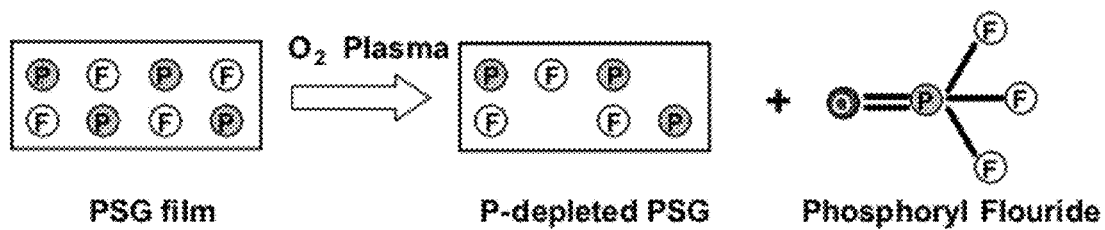
FIG. 4 is a simplified diagram showing how an $O_2$ plasma may react with fluorine and phosphorus to reduce phosphorus concentration at a surface of a PSG film.

FIG. 4 is a simplified diagram showing how an O$_2$ plasma may react with fluorine and phosphorus to reduce phosphorus concentration at a surface of a PSG film. Following an etch step, a halogen, such as fluorine, may remain within a processing chamber and at surfaces of a deposited film. A halogen scavenger, such as O$_2$ plasma, may be used to react with and remove the remaining halogen as described above. The O$_2$ plasma may also react with the halogen and phosphorus in the PSG film. As an example, the O$_2$ plasma may react with fluorine and phosphorus to create a volatile phosphoryl fluoride. This reduces phosphorus concentration at the surfaces of the PSG film.

Figure 5:
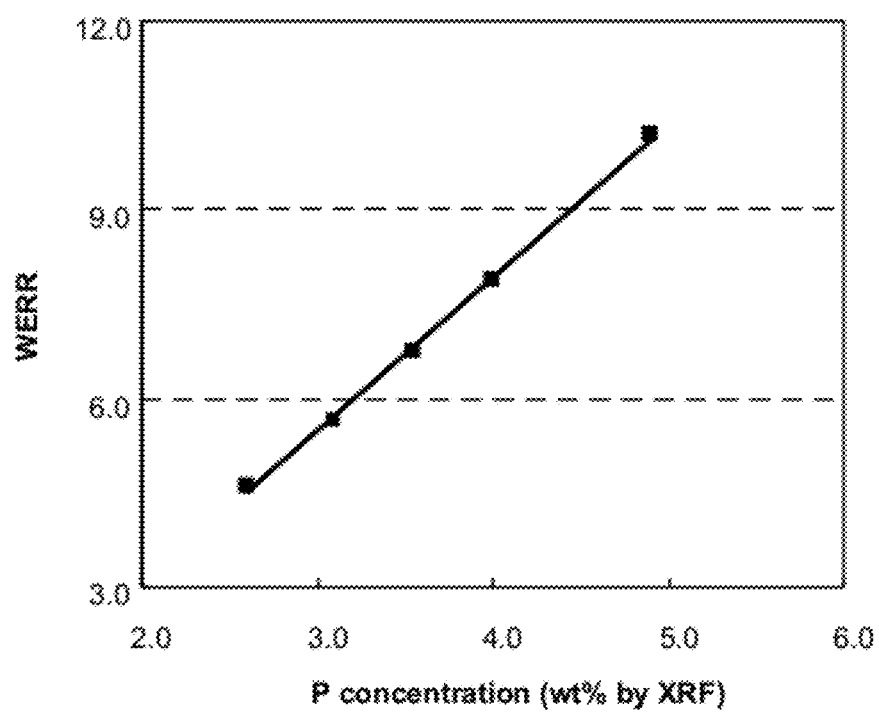
FIG. 5 is a plot of phosphorus concentration versus wet etch rate for a PSG film.

FIG. 5 is a plot of phosphorus concentration versus wet etch rate for a PSG film. As phosphorus concentration decreases, the wet etch rate of the PSG film also decreases. Since the halogen scavenger treatment can reduce phosphorus concentration at the surfaces of the PSG film, the wet etch rate becomes non-uniform across a thickness of the film. This is undesirable as it can lead to increased defects and/or reduced yield.

Figure 6:
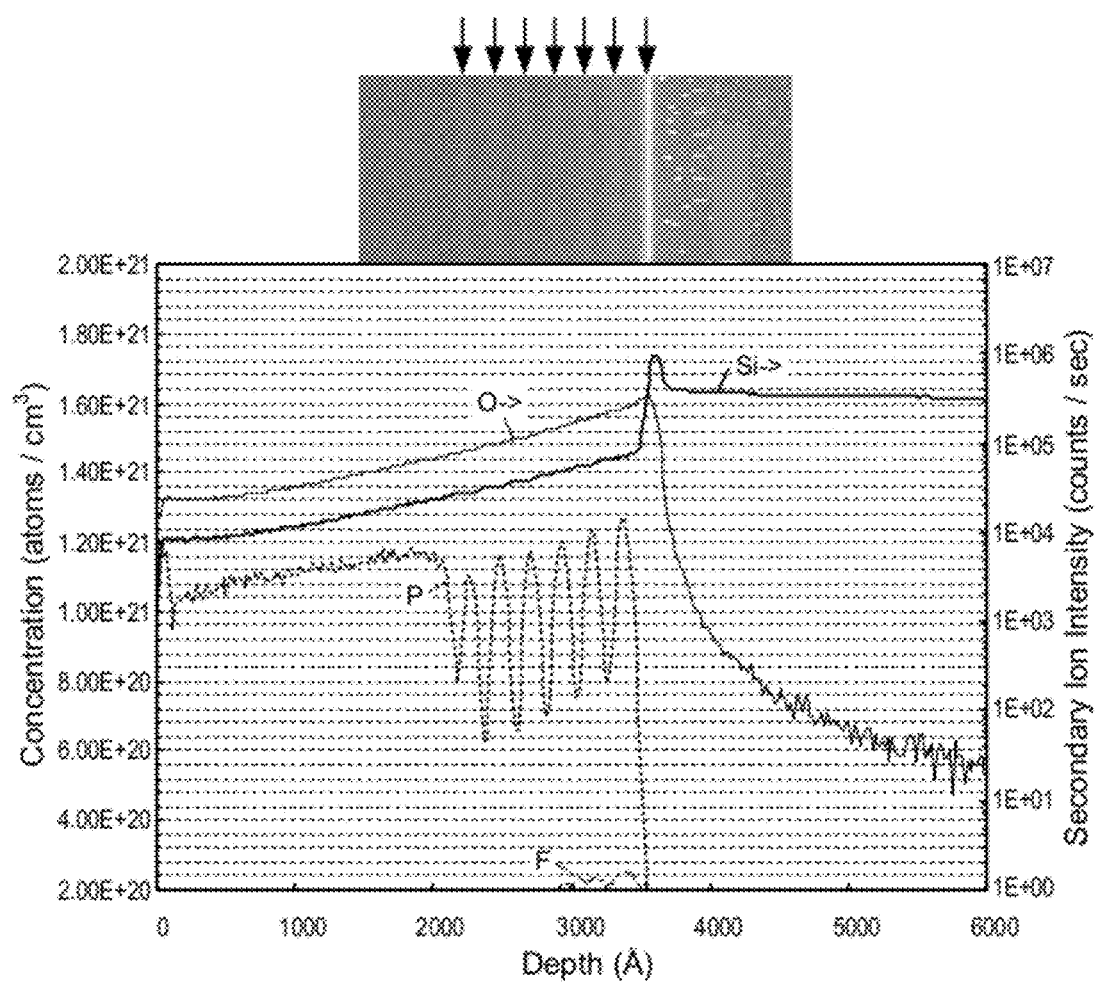
FIG. 6 is a plot of phosphorus concentration throughout a depth of a PSG film as measured by secondary ion mass spectrometry (SIMS) and a scanning electron micrograph (SEM) image showing phosphorus depletion regions throughout the depth of the PSG film.

FIG. 6 is a plot of phosphorus concentration throughout a depth of a PSG film as measured by secondary ion mass spectrometry (SIMS). FIG. 6 also includes a scanning electron micrograph (SEM) image showing phosphorus depletion regions throughout the depth of the PSG film. The depth along the x-axis of the plot is approximately aligned with the SEM image. The plot shows that phosphorus concentration is relatively uniform for about the first 2000Å of the film, or throughout a first deposition and etch cycle. At a depth of about 2200Å the phosphorus concentration declines sharply. This depth corresponds to a portion of the film that is exposed to a halogen scavenger treatment following the first deposition and etch cycle. As shown in the SEM image, the reduced phosphorus concentration can be seen as a light-gray line that corresponds to an interface between layers in the PSG film. The layers correspond to deposition and etch cycles (and halogen scavenger treatments) and occur about every 200-250Å throughout the remainder of the PSG film.

The phosphorus that is removed from the PSG film during the halogen scavenger treatment can be replaced by exposing the film to a phosphorus-containing gas. In one embodiment, for example, the film is exposed to a plasma formed using a gas comprising PH$_3$. Some of the conditions used during the phosphorus exposure step may be the same as those used during deposition steps, and in some embodiments the plasma may be maintained throughout the exposure and subsequent deposition step.

Figure 7:
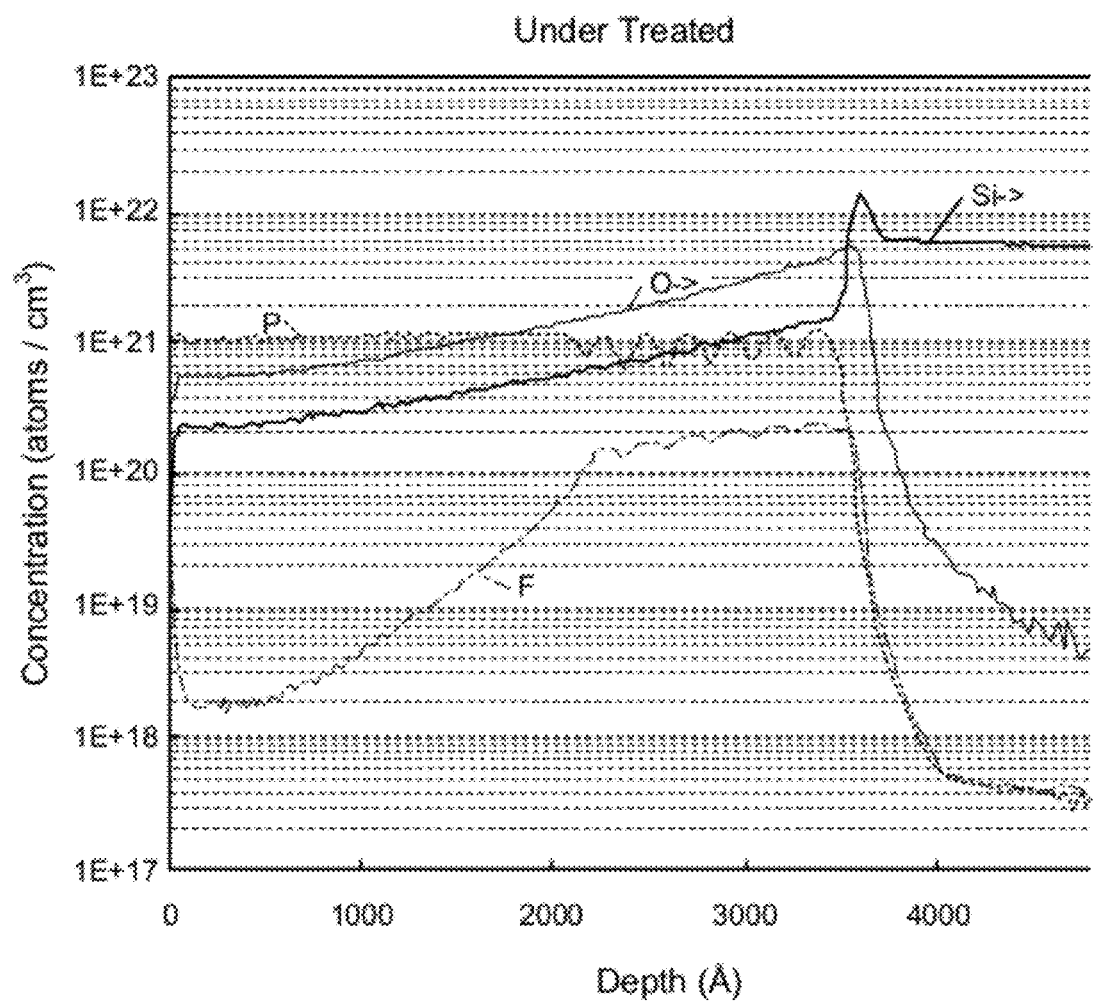
FIG. 7 is a plot of phosphorus concentration throughout a depth of a PSG film after phosphorus exposure in accordance with an embodiment of the invention.
Figure 8:
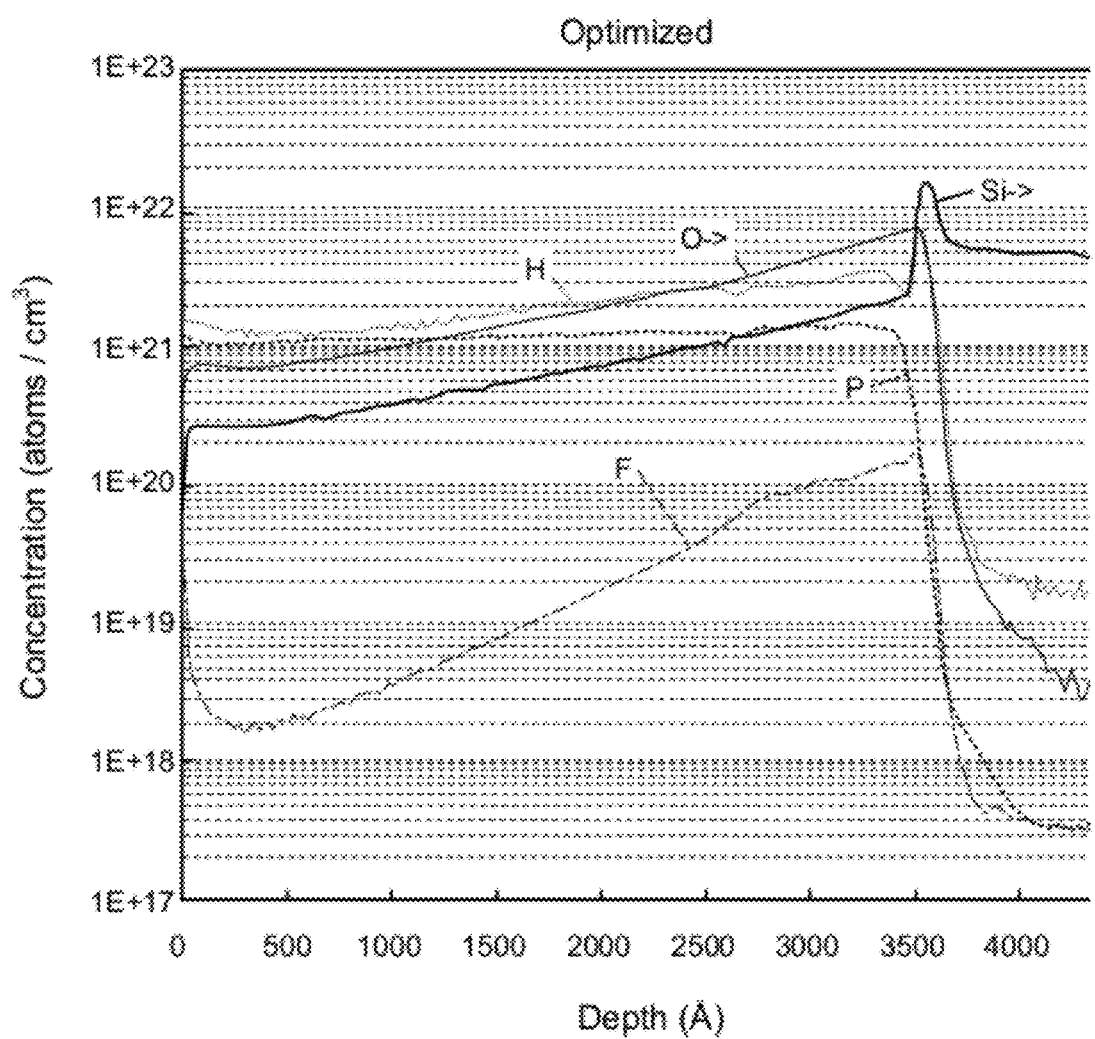
FIG. 8 is a plot of phosphorus concentration throughout a depth of a PSG film after phosphorus exposure in accordance with another embodiment of the invention.
Figure 9:
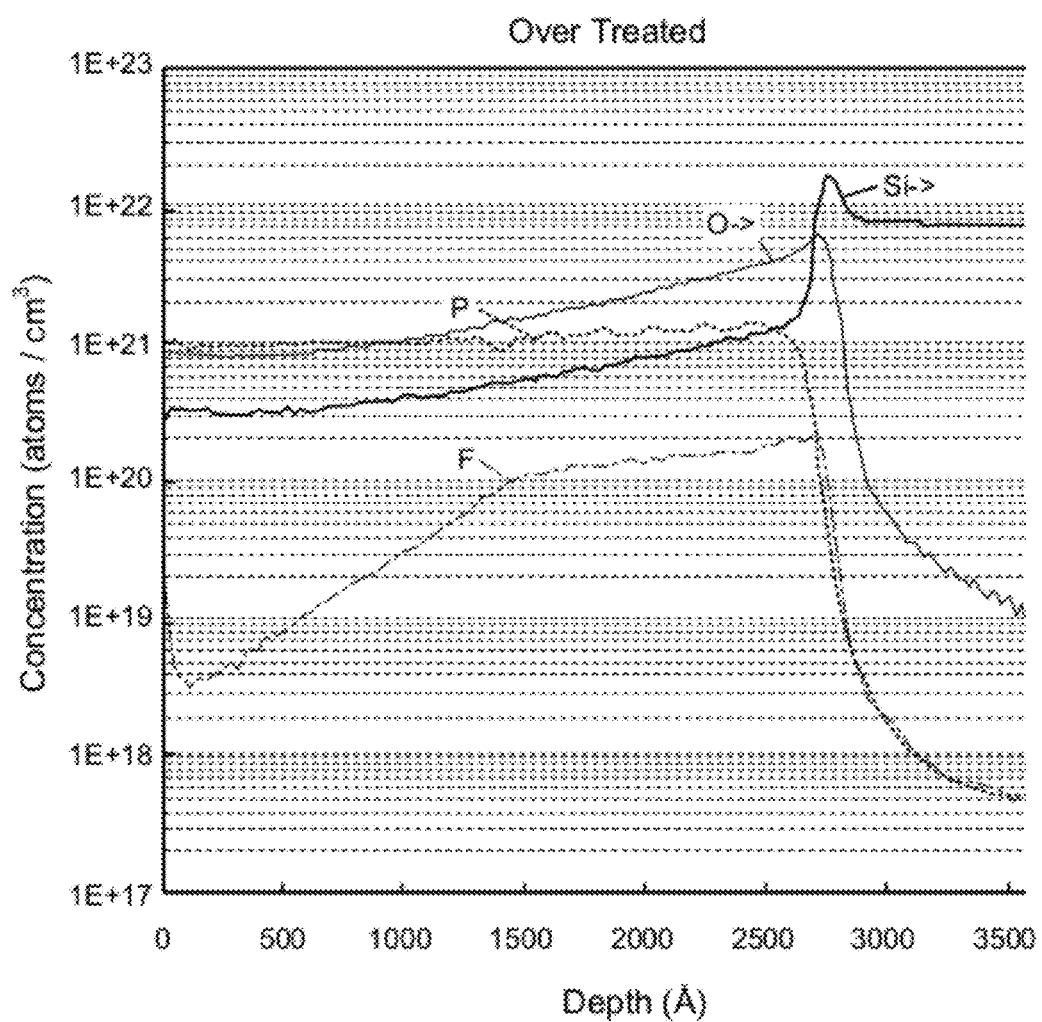
FIG. 9 is a plot of phosphorus concentration throughout a depth of a PSG film after phosphorus exposure in accordance with yet another embodiment of the invention.

The conditions used during the exposure (e.g., temperature, pressure, time, gas flow rate, RF power, etc.) may depend on the phosphorus concentration in the PSG film and the amount of phosphorus removed during the halogen scavenger treatment. FIGS. 7-9 are plots of phosphorus concentration throughout a depth of a PSG film after phosphorus exposure in accordance with embodiments of the present invention. As shown in FIG. 7, the phosphorus exposures used in this example fail to replenish all of the phosphorus removed during the halogen scavenger steps. In the example of FIG. 8, the exposure time was increased and the resulting phosphorus concentration is nearly constant throughout the film. In the example of FIG. 9, the exposure time was increased further resulting in an increase in phosphorus concentration compared to the bulk concentration in the film.

Exemplary Substrate Processing System

Figure 10:
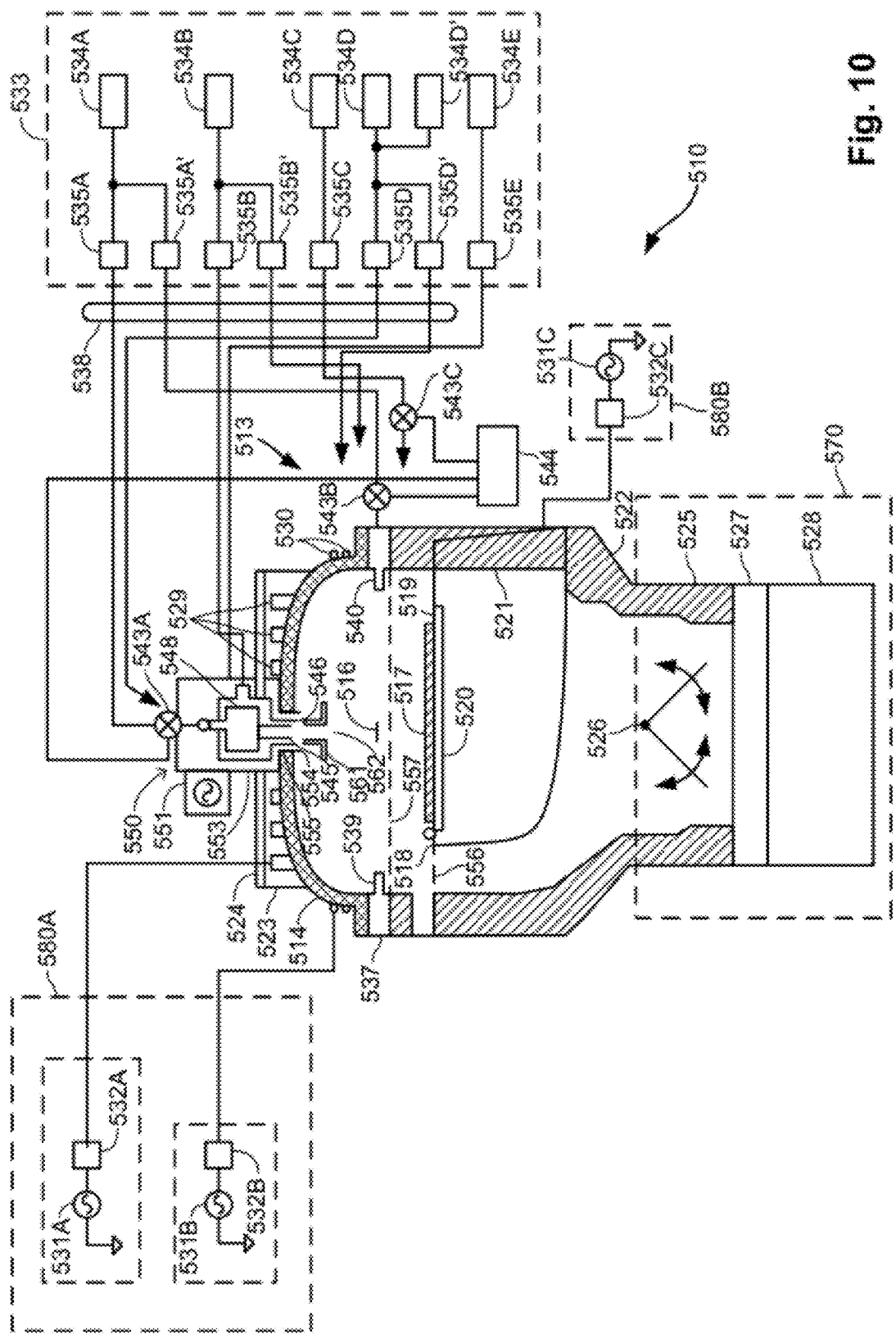
FIG. 10 is a simplified diagram of one embodiment of a high-density-plasma chemical-vapor-deposition system with which methods of the invention may be implemented.

The inventors have implemented embodiments of the invention with the ULTIMA™ system manufactured by APPLIED MATERIALS, INC., of Santa Clara, Calif. An overview of the system is provided in connection with FIG. 10. FIG. 10 schematically illustrates the structure of such an HDP-CVD system 510 in one embodiment. The system 510 includes a chamber 513, a vacuum system 570, a source plasma system 580A, a bias plasma system 580B, a gas delivery system 533, and a remote plasma cleaning system 550.

The upper portion of chamber 513 includes a dome 514, which is made of a ceramic dielectric material, such as aluminum oxide or aluminum nitride. Dome 514 defines an upper boundary of a plasma processing region 516. Plasma processing region 516 is bounded on the bottom by the upper surface of a substrate 517 and a substrate support member 518.

A heater plate 523 and a cold plate 524 surmount, and are thermally coupled to, dome 514. Heater plate 523 and cold plate 524 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 513 includes a body member 522, which joins the chamber to the vacuum system. A base portion 521 of substrate support member 518 is mounted on, and forms a continuous inner surface with, body member 522. Substrates are transferred into and out of chamber 513 by a robot blade (not shown) through an insertion/removal opening (not shown) in the side of chamber 513. Lift pins (not shown) are raised and then lowered under the control of a motor (also not shown) to move the substrate from the robot blade at an upper loading position 557 to a lower processing position 556 in which the substrate is placed on a substrate receiving portion 519 of substrate support member 518. Substrate receiving portion 519 includes an electrostatic chuck 520 that secures the substrate to substrate support member 518 during processing. In a preferred embodiment, substrate support member 518 is made from an aluminum oxide or aluminum ceramic material.

Vacuum system 570 includes throttle body 525, which houses twin-blade throttle valve 526 and is attached to gate valve 527 and turbo-molecular pump 528. It should be noted that throttle body 525 offers minimum obstruction to gas flow, and allows symmetric pumping. Gate valve 527 can isolate pump 528 from throttle body 525, and can also control chamber pressure by restricting the exhaust flow capacity when throttle valve 526 is fully open. The arrangement of the throttle valve, gate valve, and turbo-molecular pump allow accurate and stable control of chamber pressures between about 1 millitorr to about 2 torr.

The source plasma system 580A includes a top coil 529 and side coil 530, mounted on dome 514. A symmetrical ground shield (not shown) reduces electrical coupling between the coils. Top coil 529 is powered by top source RF (SRF) generator 531A, whereas side coil 530 is powered by side SRF generator 531B, allowing independent power levels and frequencies of operation for each coil. This dual coil system allows control of the radial ion density in chamber 513, thereby improving plasma uniformity. Side coil 530 and top coil 529 are typically inductively driven, which does not require a complimentary electrode. In a specific embodiment, the top source RF generator 531A provides up to 2,500 watts of RF power at nominally 2 MHz and the side source RF generator 531B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 580B includes a bias RF ("BRF") generator 531C and a bias matching network 532C. The bias plasma system 580B capacitively couples substrate portion 517 to body member 522, which act as complimentary electrodes. The bias plasma system 580B serves to enhance the transport of plasma species (e.g., ions) created by the source plasma system 580A to the surface of the substrate. In a specific embodiment, BRF generator provides up to 10,000 watts of RF power at a frequency less than 5 MHz, as discussed further below.

RF generators 531A and 531B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 532A and 532B match the output impedance of generators 531A and 531B with their respective coils 529 and 530. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 533 provides gases from several sources 534A-534E to the chamber 513 via gas delivery lines 538 (only some of which are shown). As would be understood by a person of skill in the art, the actual sources used for sources 534A-534E, and the actual connection of delivery lines 538 to chamber 513, varies depending on the deposition and cleaning processes executed within chamber 513. Gases are introduced into chamber 513 through a gas ring 537 and/or a top nozzle 545.

Referring again to FIG. 10, chamber 513 also has top nozzle 545 and top vent 546. Top nozzle 545 and top vent 546 allow independent control of top and side flows of the gases, which improves film uniformity and allows fine adjustment of the film's deposition and doping parameters. Top vent 546 is an annular opening around top nozzle 545. In one embodiment, first gas source 534A supplies source gas nozzles 539 and top nozzle 545. Source MFC 535A' controls the amount of gas delivered to source gas nozzles 539 and top MFC 535A controls the amount of gas delivered to top gas nozzle 545. Similarly, two MFCs 535B and 535B' may be used to control the flow to both top vent 546 and oxidizer gas nozzles 540 from a single source, such as source 534B. The gases supplied to top nozzle 545 and top vent 546 may be kept separate prior to flowing the gases into chamber 513, or the gases may be mixed in top plenum 548 before they flow into chamber 513. Separate sources of the same gas may be used to supply various portions of the chamber.

A remote microwave-generated plasma cleaning system 550 is provided to periodically clean deposition residues from chamber components. The cleaning system includes a remote microwave generator 551 that creates a plasma from a cleaning gas source 534E (e.g., molecular fluorine, nitrogen trifluoride, other fluorocarbons or equivalents) in reactor cavity 553. The reactive species resulting from this plasma are conveyed to chamber 513 through cleaning gas feed port 554 via applicator tube 555. The materials used to contain the cleaning plasma (e.g., cavity 553 and applicator tube 555) must be resistant to attack by the plasma. The distance between reactor cavity 553 and feed port 554 should be kept as short as practical, since the concentration of desirable plasma species may decline with distance from reactor cavity 553. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 520, do not need to be covered with a dummy wafer or otherwise protected, as may be required with an in situ plasma cleaning process. In FIG. 10, the plasma-cleaning system 550 is shown disposed above the chamber 513, although other positions may alternatively be used.

A baffle 561 may be provided proximate the top nozzle to direct flows of source gases supplied through the top nozzle into the chamber and to direct flows of remotely generated plasma. Source gases provided through top nozzle 545 are directed through a central passage 562 into the chamber, while remotely generated plasma species provided through the cleaning gas feed port 554 are directed to the sides of the chamber 513 by the baffle 561.

It should be noted that the methods and apparatuses discussed throughout the specification are provided merely as examples. Various embodiments may omit, substitute, or add various steps or components as appropriate. For instance, it should be appreciated that features described with respect to certain embodiments may be combined in various other embodiments. Furthermore, embodiments may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may be adapted to perform the necessary takes. The term "computer-readable medium" includes, but is not limited to, portable or fixed storage devices, optical storage devices, sim cards, other smart cards, and various other mediums capable of storing, containing, or carrying instructions or data.

Those of ordinary skill in the art will realize that specific parameters can vary for different processing chambers and different processing conditions, without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing a phosphosilicate glass (PSG) film on a substrate disposed in a substrate processing chamber, the method comprising:
   depositing a first portion of the PSG film over the substrate and within a gap using a high-density plasma process;
   etching back a portion of the first portion of the PSG film, wherein etching back the portion comprises:
      flowing a halogen precursor to the substrate processing chamber;
      forming a high-density plasma from the halogen precursor; and
      terminating flowing the halogen precursor after the portion has been etched back;
   flowing a halogen scavenger to the substrate processing chamber to react with residual halogen in the substrate processing chamber;
   thereafter, exposing the first portion of the PSG film to a phosphorus-containing gas to provide a substantially uniform phosphorus concentration throughout the first portion of the PSG film; and
   thereafter, depositing a second portion of the PSG film over the first portion of the PSG film and within the gap using a high-density plasma process.

2. The method recited in claim 1 wherein the halogen precursor comprises a fluorine precursor and the halogen scavenger comprises $O_2$.

3. The method recited in claim 1 wherein the phosphorus-containing gas comprises $PH_3$.

4. The method recited in claim 1 wherein depositing the first portion of the PSG film comprises:
   flowing a silicon-containing gas into the substrate processing chamber;
   flowing an oxygen-containing gas into the substrate processing chamber;
   flowing the phosphorus-containing gas into the substrate processing chamber;
   flowing a fluent gas into the substrate processing chamber;
   forming a first high-density plasma from the silicon-containing gas, the oxygen-containing gas, the phosphorus-containing gas, and the fluent gas; and
   depositing the first portion of the PSG film using the first high-density plasma at a deposition rate between 500 and 6000 Å/min and with a deposition/sputter ratio greater than 20, wherein the deposition/sputter ratio is defined as a ratio of a net deposition rate and a blanket sputtering rate to the blanket sputtering rate.

5. The method recited in claim 4 wherein the silicon-containing gas comprises $SiH_4$, the oxygen-containing gas comprises $O_2$, and the phosphorus-containing gas comprises $PH_3$.

6. The method recited in claim 1 wherein forming the high-density plasma from the halogen precursor comprises inductively coupling a source radio-frequency power into the substrate processing chamber, the source radio-frequency power providing a power density on the substrate between 85,000 and 140,000 $W/m^2$.

7. The method recited in claim 1 further comprising:
  etching back a portion of the second portion of the PSG film, wherein etching back the portion comprises:
    flowing a halogen precursor through the first conduit from the halogen-precursor source to the substrate processing chamber;
    forming a high-density plasma from the halogen precursor; and
    terminating flowing the halogen precursor after the portion has been etched back;
  thereafter, flowing the halogen scavenger to the substrate processing chamber to react with residual halogen in the substrate processing chamber;
  thereafter, exposing the first portion of the PSG film to the phosphorus-containing gas to provide a substantially uniform phosphorus concentration throughout the second portion of the PSG film; and
  thereafter, depositing a third portion of the PSG film over the second portion of the PSG film and within the gap using a high-density plasma process.

8. A method of forming a phosphosilicate glass (PSG) film on a substrate disposed in a processing chamber, the substrate including raised features forming gaps therebetween, the method comprising:
  depositing a first portion of the PSG film over the substrate and within the gaps using a high-density plasma process;
  etching back a portion of the first portion of the PSG film using a halogen precursor;
  flowing a halogen scavenger to the processing chamber to react with residual halogen in the processing chamber; and thereafter
  exposing remaining portions of the first portion of the PSG film to a phosphorus-containing gas to provide a substantially uniform phosphorus concentration throughout the first portion of the PSG film.

9. The method of claim 8 wherein the halogen precursor comprises $NF_3$.

10. The method of claim 8 wherein the halogen scavenger comprises $O_2$.

11. The method of claim 8 wherein the halogen scavenger comprises $O_2$ plasma.

12. The method of claim 8 wherein the phosphorus-containing gas comprises $PH_3$.

13. The method of claim 8 wherein the portion of the first portion of the PSG film is etched using a high-density plasma.

14. The method of claim 8 further comprising depositing a second portion of the PSG film over the remaining portions of the first portion of the PSG film and within the gaps.

15. The method of claim 14 wherein a plasma generated during the exposing step is maintained through a deposition of the second portion of the PSG film.

16. A method of depositing a phosphosilicate glass (PSG) film on a substrate disposed in a processing chamber, the method comprising:
  depositing a first portion of the PSG film over the substrate using a high-density plasma process;
  etching the first portion of the PSG film using a high-density halogen plasma to provide an etched PSG film;
  forming a plasma comprising a halogen scavenger in the substrate processing chamber to react with residual halogen in the substrate processing chamber from the etching step; thereafter
  exposing the etched PSG film to a phosphorus-containing plasma to provide a substantially uniform phosphorus concentration throughout the etched PSG film; and thereafter
  depositing a second portion of the PSG film over the etched PSG film using a high-density plasma process.

* * * * *